United States Patent
Miladinovic

(10) Patent No.: US 9,160,369 B1
(45) Date of Patent: Oct. 13, 2015

(54) METHOD FOR ITERATIVE ERROR CORRECTION WITH DESIGNED ERROR FLOOR PERFORMANCE

(71) Applicant: Nenad Miladinovic, Campbell, CA (US)

(72) Inventor: Nenad Miladinovic, Campbell, CA (US)

(73) Assignee: Proton Digital Systems, Inc., San Jose, CA (US)

( * ) Notice: Subject to any disclaimer, the term of this patent is extended or adjusted under 35 U.S.C. 154(b) by 51 days.

(21) Appl. No.: 14/192,041

(22) Filed: Feb. 27, 2014

Related U.S. Application Data

(60) Provisional application No. 61/771,724, filed on Mar. 1, 2013.

(51) Int. Cl.
*H04L 1/00* (2006.01)
*H03M 13/11* (2006.01)
*H03M 13/29* (2006.01)

(52) U.S. Cl.
CPC ...... *H03M 13/1148* (2013.01); *H03M 13/2906* (2013.01)

(58) Field of Classification Search
CPC .................................................. H04L 1/0057
USPC .......................................... 714/776, 755, 800
See application file for complete search history.

(56) References Cited

U.S. PATENT DOCUMENTS

| | | | | |
|---|---|---|---|---|
| 5,311,521 A * | 5/1994 | Fitingof et al. | ............... | 714/755 |
| 7,064,683 B1 * | 6/2006 | Westby | ........................... | 341/50 |
| 7,376,173 B2 * | 5/2008 | Yedidia et al. | ................ | 375/141 |
| 7,590,929 B2 * | 9/2009 | Morita et al. | ................. | 714/800 |
| 7,644,337 B2 * | 1/2010 | Ito et al. | ........................ | 714/755 |
| 2011/0200088 A1 * | 8/2011 | Koslov et al. | ................. | 375/227 |

* cited by examiner

*Primary Examiner* — Fritz Alphonse
(74) *Attorney, Agent, or Firm* — Bardmesser Law Group

(57) ABSTRACT

The proposed method presents a novel error correction scheme utilizing LDPC codes that provides desired error floor performance. The error floor performance is achieved through combination of the two design parameters of the method. Encoding a block of user data of length S*K bits includes (A) dividing the block into S sub-blocks of equal length, each sub-block having K bits; (B) encoding each of the sub-blocks using a first Error-Correcting-Code; (C) computing bit-wise XOR of all the sub-blocks, thereby generating a new sub-block of K bits; and (D) encoding the new sub-block using a second Error-Correcting-Code.

11 Claims, 3 Drawing Sheets

METHOD FOR ITERATIVE ERROR CORRECTION WITH DESIGNED ERROR FLOOR PERFORMANCE

SUMMARY OF THE INVENTION

The present invention is a non-provisional of U.S. Provisional Patent Application No. 61/771,724, filed on Mar. 1, 2013, incorporated herein by reference in its entirety.

FIELD OF THE INVENTION

The invention relates to the data recovery through error correction from the storage media, volatile or non-volatile memories and magnetic media, or communication channels, copper wires/cables, optical cables and wireless radio channels. The proposed error correction scheme provides the same performance as LDPC codes of the same code rate without the error floor issues associated with LDPC codes.

BACKGROUND OF THE INVENTION

The communication and storage system block diagrams are depicted in FIG. 1. Low Density Parity Check (LDPC) codes have been recognized as the class of codes that can achieve performance very close to theoretical maximum. Based on these attributes LDPC codes have been adopted for use in various communication standards, Wi-Fi 802.11, DVB, etc. The LDPC codes are known to exhibit the error floor at high Signal-To-Noise Ratios (SNR) attributed to structures known as trapping sets, absorbing sets or near code words. The error floor is degradation in performance of the LDPC codes that causes diminishing improvements in performance with increase in SNR.

The error floor behavior of LDPC codes can be mitigated to some extent by careful code construction, by using a particular internal structure and by increasing the length of the code. Each approach has its drawbacks. The code construction with error floor optimization becomes very difficult for code lengths above 3000-4000 bits due to an exponential increase in the number of structures that have to be considered by optimization algorithm. Construction of LDPC codes with particular internal structure, specifically very high column weight, is known to lower the error floor, but this method has a substantial impact on the hardware implementation of the LDPC decoder, particularly the throughput of the decoder and power consumption. Furthermore, actual performance cannot be guaranteed and has to be measured through simulations, which is often unfeasible.

Increasing the length of the code has limited impact on error floor performance, but it could be viable option for particular code rates and relaxed error floor requirements. This option also impacts the hardware implementation by requiring large memories to store the long code.

The stringent error recovery requirements, especially in storage systems like Hard Disk Drives (HDD) and Solid State Drives (SSD), are impossible to verify in practice by either software or hardware simulation, so neither of the above mentioned methods provides guaranteed performance. Therefore the error floor presents a significant challenge when designing the system with LDPC codes. This is also of great importance in the production of Hard Disk Drives (HDD), where performance of the product must be estimated during production in a very short time. The proposed invention, described below, enables such estimation so that performance is guaranteed. Therefore, the proposed method can provide significant saving in production time of the HDD's.

SUMMARY OF THE INVENTION

The present invention is related to application interfaces and, in particular, to a method and system for iterative corrections using LDPC codes with a designed error floor performance that substantially obviates one or several of the disadvantages of the related art.

The error floor of the LDPC code is caused by particular structures in the graph representation of the LDPC codes, called trapping sets, absorbing sets or near code words. The number of errors in the code word after failed decoding attempt is very low, so having an additional code/error correction scheme to correct remaining few errors is an attractive proposition, as suggested in co-owned U.S. patent application Ser. No. 13/556,088, entitled "Two Dimensional Decoding for Non-Volatile Memory Blocks", incorporated herein by reference.

However, this approach necessitates additional hardware for the additional code and the parity overhead is large because it is the multiple of the user data length. Furthermore, the latency of the system employing such scheme might be prohibitively long.

The method proposed in the present application can use the same LDPC code or a different LDPC code, as long as the code is supported by the same hardware, to provide additional layer of protection and therefore does not require additional hardware. The parity overhead of the proposed method is only a small fraction of the user data length. Additionally, many of the communication standards that adopted LDPC codes are capable of supporting LDPC codes with multiple parity options. This gives added flexibility for the implementation of the additional correction scheme. The proposed invention enables development of the error correction system that would provide desired performance without overprovisioning of the resources, which is often the case with LDPC systems, since performance in the error floor region cannot be measured.

In other embodiment, encoding a block of user data of length S*K bits includes (A) dividing the block into S sub-blocks of equal length, each sub-block having K bits; (B) encoding each of the sub-blocks using a first Error-Correcting-Code; (C) computing bit-wise XOR of all the sub-blocks, thereby generating a new sub-block of K bits; and (D) encoding the new sub-block using a second Error-Correcting-Code. For implementation in NAND flash devices, typical exemplary values are S=8 and K=8192 bits or S=8 and K=16384 bits, as constrained by the physical dimensions of the flash medium. In other applications, such as Hard Disk Drives (HDD) and wired and wireless communications suitable range for S is 4-16 and suitable range for K is 512-32768 bits.

As further options, the first Linear Error-Correcting Code is a LDPC code, for example, (8832,8256) LDPC code for NAND flash devices, although many others can be used. The second Linear Error-Correcting Code is a LDPC code, e.g., (8832,8256) LPDC. The first LDPC code may be the same code as the second LDPC code, or may be a different code. The new sub-block of XOR data of length K bits is additionally permuted prior to encoding by using the second LDPC code. The permutation changes the original ordering of the XOR data. The permutation of the XOR sequence is enables the proposed scheme to eliminate the error floor of the LDPC codes.

The method further may include the steps of receiving bit Log-Likelihood-Ratio (LLR) values of the S sub-blocks; and calculating the LLR values of the XOR sub-block from the LLR values. The LLR values of the XOR sub-block are obtained as bit-wise minima of LLR values of the S sub-blocks for each bit position. The first Error-Correcting-Code may be a BCH code capable of correcting t1 bit-errors and wherein the second Error-Correcting Code may be a BCH code capable of correcting t2 bit-errors, where t2>t1. Typical values for NAND flash for t=40-60.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

BRIEF DESCRIPTION OF THE ATTACHED FIGURES

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

The proposed method for error correction uses two blocks, an encoder and a decoder with block diagrams depicted in the figures. The user information that is to be protected is given with the following block of bits:

$$U_{11}U_{12}\ldots U_{1K}U_{21}U_{22}\ldots U_{2K}\ldots U_{S1}U_{S2}\ldots U_{SK}$$

As one example, in a NAND flash application based on the (8832,8256) LDPC code using 8192 user bits and S=16, total block size is 132096. The SK user bits are divided/de-multiplexed into S sub-blocks and each sub-block is encoded by LDPC1 code, creating M=N−K parities (typical values of N=8832, K=8256, M=576):

$$P_{i1}P_{i2}\ldots P_{iM1}$$

The user information in S sub-blocks is then summed by exclusive OR (XOR-ed), as follows:

$$X_i = \oplus_{j=1}^{S} U_{ji}$$

to obtain the sequence of K XOR bits $X_1 X_2 \ldots X_K$.

This sequence is now encoded with LDPC2 code, which may or may not be same as the LDPC1 code, to obtain the additional parity bits, $$PX_1 PX_2 \ldots PX_{M2}$$

For the purpose of illustrating the method, data is formatted as $$U_{11}U_{12}\ldots U_{1K}P_{11}P_{12}\ldots P_{1M1}U_{21}U_{22}\ldots U_{2K}P_{21}$$
$$P_{22}\ldots P_{2M1}\ldots U_{S1}U_{S2}\ldots U_{SK}P_{S1}P_{S2}\ldots$$
$$P_{SM1}PX_1 PX_2 \ldots PX_{M2}$$

before it is written to the media/memory or transmitted through a communication channel. The encoding of LDPC codes with LDPC1 and LDPC2 can be achieved in multiple ways, and some methods are described in Thomas J. Richardson and Rüdiger L. Urbanke, "Efficient Encoding of Low-Density Parity-Check Codes," IEEE Transactions in Information Theory, 47(2), February 2001. Other formats are also possible, as long as data is de-interleaved accordingly in the decoder block. The overall code rate of the proposed scheme is:

$$r = \frac{S \cdot K}{S \cdot (K + M1) + M2}$$

Typical code rates in communications are r=0.5-0.9 and in storage are r=0.85-0.95. The number of sub-blocks S and LDPC codes LDPC1 and LDPC2 are design parameters that are selected to satisfy desired code rate r and desired error floor performance.

Figure 1:
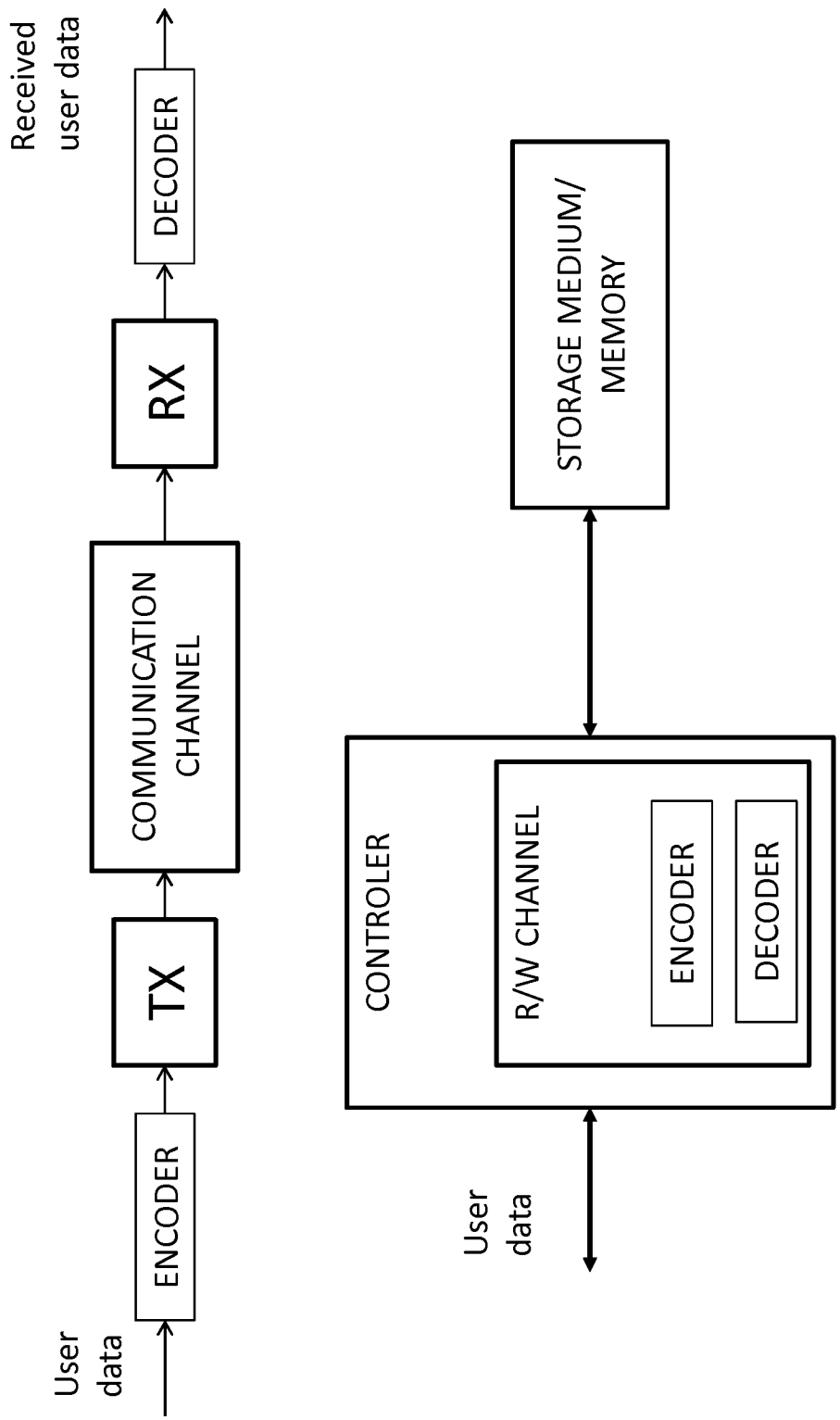
FIG. 1 illustrates Communication and Storage System Block Diagrams.
Figure 2:
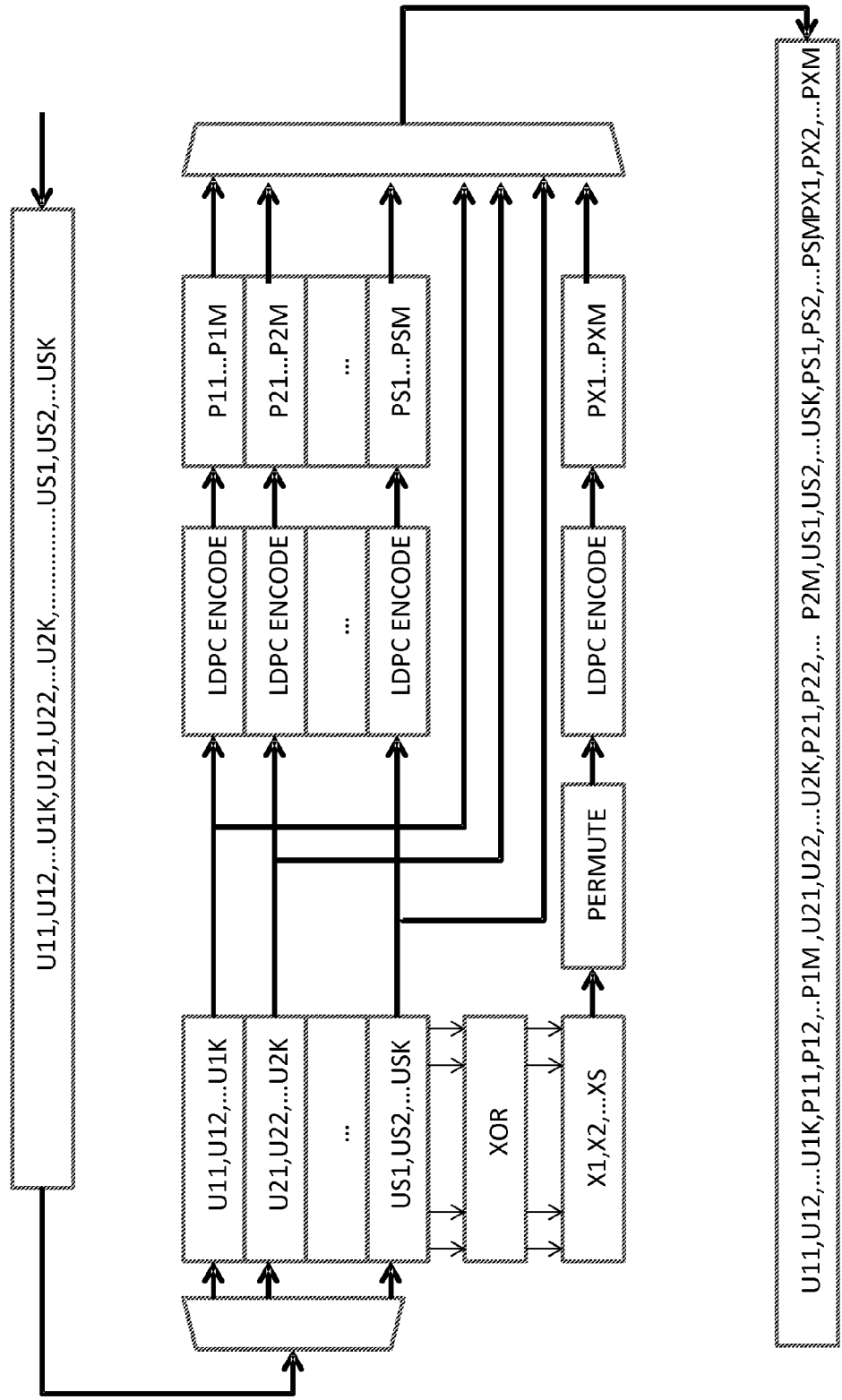
FIG. 2 illustrates an encoding block diagram according to one embodiment of the invention.
Figure 3:
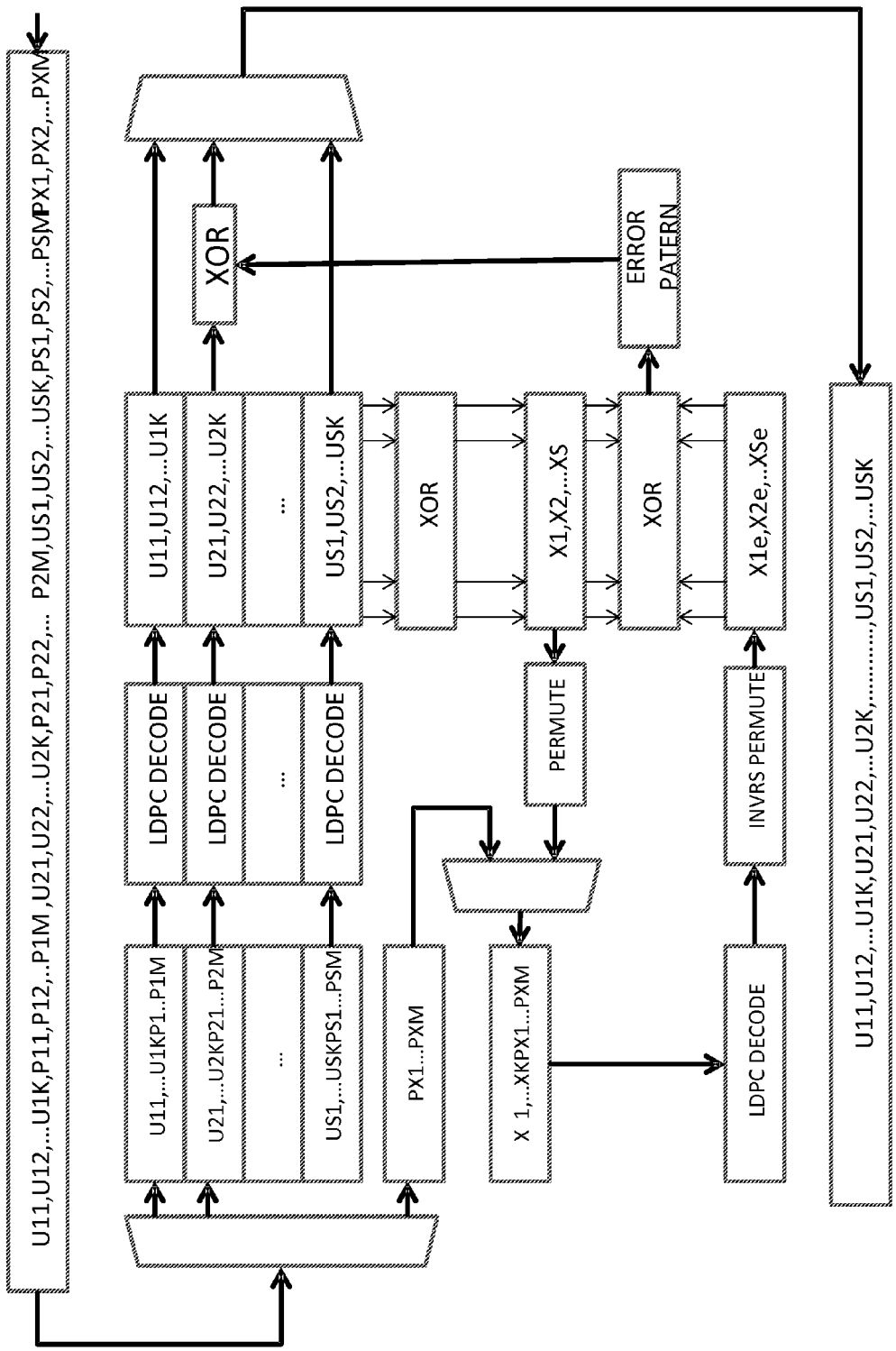
FIG. 3 illustrates a Decoding block diagram according to one embodiment of the invention.

When data is read from the storage medium/memory or received from communication channel, data recovery is performed as described in block diagram in FIG. 2. The received data is de-multiplexed in S sub-blocks and each sub-block is decoded by LDPC1 code decoder. The LDPC decoding method can be any of the methods described in T. Richardson and R. Urbanke, "The capacity of low-density parity-check codes under message-passing decoding", IEEE Transactions in Information Theory, vol. 47, pp. 599-618, 2001, and Jinghu Chen, Ajay Dholakia, Evangelos Eleftheriou, Marc P. C. Fossorier and Xiao-Yu Hu "Reduced Complexity Decoding of LDPC Codes", IEEE Transactions on Communications, Vol. 53, No. 8, August 2005.

If all S blocks are recovered successfully, user data is passed. If any of the S sub-blocks has failed decoding, the reconstructed XOR information is obtained by XOR-ing the outputs of S LDPC1 decoders and obtaining sequence $X_e$. This sequence is passed through the permutation block and is combined with the LDPC2 code parity bits from the input. The reconstructed code word is decoded by LDPC2 code decoder. The decoded sequence is passed through the block performing inverse permutation to obtain recovered XOR sequence X. The sequence X is XOR-ed with initial XOR sequence $X_e$ to obtain the error location sequence. The error location sequence is XOR-ed with the output of the failed LDPC1 decoder to recover the correct user data.

The method proposed in this invention is guaranteed to recover one failed sub-block that failed due to LDPC1 error floor. This stems from the fact that a small number of errors caused by an error floor event in LDPC1 code are easily recovered by LDPC2 code. The LDPC2 code has different structure from LDPC1 code, therefore, a possibility that an error pattern that caused error floor in LDPC1 code also causes the error floor in LDPC2 code is extremely small. Additionally the permutation blocks provide the same assurance in case that LDPC2 code is same as LDPC1 code.

Since number of errors caused by error floor event is very small, the LDPC2 code can be very high rate LDPC code (i.e., the number of additional parities $PX_1, PX_2, \ldots PX_{M2}$ is very small).

The error correction performance of the proposed error correction method, sector failure rate (SFR), can be mathematically expressed in terms of the SFR performance p of the component code LDPC1 as follows:

$$SFR = 1 - (1-p)^{(s-1)}(1 + p(S-1))$$

This equation enables exact prediction of the SFR performance at very low error rates, SFR~$10^{-15}$ by measuring/simulating performance of the component LDPC1 code at much higher SFR rates (SFR~$1e-8$). Direct simulation of SFR~$10^{-15}$ is extremely hard even in hardware, requiring large number of hardware platforms to achieve measurement in reasonable time. Using the proposed method, measuring performance of the component LDPC code at SFR~$10^{-8}$ can be achieved by simple PC computer simulation in a few days.

This equation also enables design of the error correction scheme for targeted error rate performance, by choosing the number of sub-blocks/component code words S and component LDPC code without overprovisioning of the hardware resources.

Having thus described a preferred embodiment, it should be apparent to those skilled in the art that certain advantages of the described method and apparatus have been achieved.

It should also be appreciated that various modifications, adaptations and alternative embodiments thereof may be made within the scope and spirit of the present invention. The invention is further defined by the following claims.

What is claimed is:

1. A method of encoding a block of user data of length S*K bits, comprising the steps of:
   (A) dividing the block into S sub-blocks of equal length, each sub-block having K bits;
   (B) encoding each of the sub-blocks using a first Error-Correcting-Code;
   (C) computing bit-wise XOR of all the sub-blocks, thereby generating a new sub-block of K bits; and
   (D) encoding the new sub-block using a second Error-Correcting-Code and storing the encoded new sub-block on a storage medium.

2. The method of claim 1, wherein in step (B), each sub-block is encoded using a first Linear Error-Correcting Code, and wherein in step (D), the user data is encoded using a second Linear Error-Correcting Code.

3. The method of claim 2, wherein the first Linear Error-Correcting Code is a LDPC code.

4. The method of claim 3, wherein the second Linear Error-Correcting Code is a LDPC code.

5. The method of claim 4, wherein the first LDPC code is the same code as the second LDPC code.

6. The method of claim 4, wherein the first LDPC code is different from the second LDPC code.

7. The method of claim 4, wherein the new sub-block of XOR data of length K bits is additionally permuted prior to encoding by using the second LDPC code.

8. The method of claim 4, further comprising the steps of receiving bit LLR values of the S sub-blocks; and calculating the LLR values of the XOR sub-block from the LLR values.

9. The method of claim 8, wherein the LLR values of the XOR sub-block are obtained as bit-wise minima of LLR values of the S sub-blocks for each bit position.

10. The method of claim 1, wherein the first Error-Correcting-Code is a BCH code capable of correcting t1 bit-errors and wherein the second Error-Correcting Code is a BCH code capable of correcting t2 bit-errors, where t2>t1.

11. A system for encoding a block of user data of length S*K bits, comprising:
   (A) a circuit for dividing the block into S sub-blocks of equal length, each sub-block having K bits;
   (B) a first encoder that encodes each of the sub-blocks using a first Error-Correcting-Code;
   (C) a circuit for computing bit-wise XOR of all the sub-blocks, thereby generating a new sub-block of K bits; and
   (D) a second encoder that encodes the new sub-block using a second Error-Correcting-Code; and
   (E) a circuit that transmits the encoded new sub-block to a storage medium.

* * * * *